United States Patent
Asahi et al.

(10) Patent No.: US 8,476,171 B2
(45) Date of Patent: Jul. 2, 2013

(54) HEAT TREATMENT METHOD OF ZNTE SINGLE CRYSTAL SUBSTRATE AND ZNTE SINGLE CRYSTAL SUBSTRATE

(75) Inventors: Toshiaki Asahi, Toda (JP); Kenji Sato, Tokyo (JP); Takayuki Shimizu, Toda (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 1349 days.

(21) Appl. No.: 11/988,755

(22) PCT Filed: Jul. 18, 2006

(86) PCT No.: PCT/JP2006/314157
§ 371 (c)(1),
(2), (4) Date: Jan. 14, 2008

(87) PCT Pub. No.: WO2007/010890
PCT Pub. Date: Jan. 25, 2007

(65) Prior Publication Data
US 2009/0042002 A1    Feb. 12, 2009

(30) Foreign Application Priority Data
Jul. 21, 2005  (JP) ................. 2005-211011

(51) Int. Cl.
*H01L 21/00* (2006.01)
(52) U.S. Cl.
USPC .......................... 438/796; 438/799
(58) Field of Classification Search
USPC ............... 438/795, 799; 257/E21.698, 614
See application file for complete search history.

(56) References Cited

U.S. PATENT DOCUMENTS

| 6,791,257 B1 | 9/2004 | Sato et al. |
| 2004/0155255 A1 | 8/2004 | Yamamoto et al. |

FOREIGN PATENT DOCUMENTS

| JP | 11-12078 A | 1/1999 |
| JP | 2001-053080 A | 2/2001 |
| JP | 2004-158731 A * | 6/2004 |

OTHER PUBLICATIONS

T. Yabe et al., "Reduction of Te inclusions in ZnTe single crystals by thermal annealing", phys. stat. sol. No. 4, pp. 921-924, Feb. 2004.*
Chinese Office Action dated Nov. 22, 2010 issued in corresponding Chinese Patent Application No. 200680026704.X (with English translation).

(Continued)

*Primary Examiner* — Daniel Whalen
(74) *Attorney, Agent, or Firm* — Birch, Stewart, Kolasch & Birch, LLP

(57) ABSTRACT

The present invention is to provide a heat treatment method for effectively eliminating Te deposits in a ZnTe single crystal substrate, and a ZnTe single crystal substrate having an optical characteristic suitable for use of a light modulation element and having a thickness of 1 mm or more. A heat treatment method of a ZnTe single crystal substrate, includes: a first step of increasing a temperature the ZnTe single crystal substrate to a first heat treatment temperature T1, and retaining the temperature of the substrate for a predetermined time; and a second step of gradually reducing the temperature of the substrate from the first heat treatment temperature T1 to a second heat treatment temperature T2 lower than the heat treatment temperature T1 with a predetermined rate, wherein the first heat treatment temperature T1 is set in a range of 700° C.$\leq$T1$\leq$1250° C. and the second heat treatment temperature T2 is set in a range of T2$\leq$T1−50.

4 Claims, 2 Drawing Sheets

OTHER PUBLICATIONS

T. Yabe et al.; Reduction of Te inclusions in ZnTe single crystals by thermal melting; physica status solidi (c); No. 4; pp. 921-924; 2004.

Russian Office Action mailed Jun. 18, 2010 for corresponding Russian Application No. 2008106608/05.

Yabe, T. et al. "Reducing of Te Inclusions in ZnTe Single Crystals by Thermal Annealing". Wiley-VCH Verlag GmbH & Co. KGaA. Weinheim 2004. pp. 921-924. XP-002483126.

Uchida, M. et al. "Stoichiometry control of Zn Te Single Crystals by the Vapor Pressure-Controled Wafer-Annealing Method". Journal of Crystal Growth vol. 216, 2000, pp. 134-140.

Chinese Office Action dated Jun. 23, 2011 issued in corresponding Chinese Patent Application No. 200680026704.X (with English translation).

Office Action in U.S. Appl. No. 13/158,618, dated Feb. 15, 2012.

Office Action in U.S. Appl. No. 13/158,618, dated May 31, 2012.

Zhou et al., "Characterization of Growth Defects in ZnTe Single Crystals", Materials Research Society Symposium Proceedings, vol. 299, 1994, pp. 203-208.

* cited by examiner (a) BEFORE HEAT TREATMENT        (a) AFTER HEAT TREATMENT

HEAT TREATMENT METHOD OF ZNTE SINGLE CRYSTAL SUBSTRATE AND ZNTE SINGLE CRYSTAL SUBSTRATE

TECHNICAL FIELD

The present invention relates to a technique for improving the crystallinity of a II-VI group compound semiconductor single crystal suitable for a substrate for a light modulation element. In particular, the present invention relates to a heat treatment technique for eliminating deposits included in a ZnTe single crystal to improve the light transmission.

BACKGROUND ART

Because a compound semiconductor crystal comprising the 12 (2B) group element and the 16 (6B) group element in the periodic table (hereinafter referred to as a II-VI group compound semiconductor) has various forbidden band widths, the crystal has various optical characteristics. Further, the II-VI group compound semiconductor has been expected to be used as material for a light modulation element for example. However, in case of the II-VI group compound semiconductor, because it is difficult to control the stoichiometric composition (stoichiometry), it is difficult to grow a good bulk crystal by the traditional manufacture technique.

For example, in ZnTe, a composition at the melting point is shifted to Te from the stoichiometric composition. Thus, in grown crystals, there is some possibility that deposits that are presumably caused by excessive Te, remain. Because the Te deposits have sizes of a few μm and densities of about $10^5$ $cm^{-3}$, the Te deposits are a cause of a remarkable decrease in the light transmission of a ZnTe single crystal substrate. The ZnTe single crystal substrate having such a low light transmission is not suitable for a light modulation element or the like using an electro-optic effect, in which laser light passes through a crystal having a thickness of about 10 mm.

As a technique for reducing the deposits in the ZnTe single crystal, there is a method for growing the ZnTe single crystal by using epitaxial growth technique. According to this technique, it is possible to manufacture a ZnTe single crystal having a superior crystallinity.

The present applicant has suggested a method for manufacturing a II-VI group compound semiconductor single crystal that comprises at least: a first step of increasing a temperature of a II-VI group compound semiconductor single crystal to a first heat treatment temperature T1 and retaining the temperature of the crystal for a predetermined time; and a second step of gradually reducing the temperature of the crystal from the first heat treatment temperature T1 to a second heat treatment temperature T2 lower than the heat treatment temperature T1 with a predetermined rate (Patent Publication 1). According to the invention disclosed in Patent Publication 1, in the first step, it is possible to eliminate the deposits consisting of the 16 group element (e.g., Te) and in the second step, it is possible to eliminate the deposits consisting of polycrystal and the like.

Patent Publication 1: Japanese Laid-Open Publication No. 2004-158731

DISCLOSURE OF THE INVENTION

Problem to be Solved by the Invention

However, although the above epitaxial growth technique is effective for growing a ZnTe single crystal having a relatively thin thickness (e.g., about a few μm), excessive time and cost is required when a ZnTe single crystal having a thickness of 1 mm or more is grown. This technique is not a realistic option.

Furthermore, although the above heat treatment method disclosed in Patent Publication 1 can eliminate the Te deposits in a ZnTe single crystal substrate having a thickness up to 1 mm and is effective, it was found that this method was not always effective for a substrate having a thickness of 1 mm or more used for a light modulation element or the like because there were some cases that a heat treatment effect was not sufficiently obtained.

Specifically, in case that the thickness of the ZnTe single crystal substrate is 1 mm or more, when a heat treatment process (the first step+the second step) was carried out for about 100 hours in consideration of productivity in the above-described heat treatment method of Patent Publication 1, the ZnTe single crystal substrate obtained after the heat treatment had a light transmission (at a wavelength of 1000 nm) of 50% or less, and was not suitable for an application for a light modulation element or the like. The cross section of the ZnTe single crystal substrate was also observed by an optical microscope. In the cross section, no deposits was shown in a region having a depth of about 0.20 mm from the surface. However, in a further inner region, Te deposits having sizes of 3 to 10 μm remained and the densities thereof were the same as that of the crystal before the heat treatment.

In order for a ZnTe single crystal substrate having a thickness of 1 mm or more to have a light transmission (wavelength: 1000 nm) of 50% or more by using the heat treatment method disclosed in Patent Publication 1, it is required that a heat treatment is carried out for 200 hours or more depending on the heat treatment temperature. It was clear that the productivity was remarkably deteriorated.

Thus, the present inventors considered that the heat treatment method according to the above prior application is effective for eliminating Te deposits but can be further improved. Thus, the present inventors have keenly studied the heat treatment method of a ZnTe compound semiconductor single crystal.

It is an object of the present invention to provide a heat treatment method for effectively eliminating Te deposits in a ZnTe single crystal substrate and a ZnTe single crystal substrate having a thickness of 1 mm or more that has an optical characteristic suitable for a light modulation element or the like.

Means for Solving the Problem

The present invention is a heat treatment method of a ZnTe single crystal substrate, comprising: a first step of increasing a temperature the ZnTe single crystal substrate to a first heat treatment temperature T1, and retaining the temperature of the substrate for a predetermined time; and a second step of gradually reducing the temperature of the substrate from the first heat treatment temperature T1 to a second heat treatment temperature T2 lower than the heat treatment temperature T1 with a predetermined rate, wherein the first heat treatment temperature T1 is set in a range of $700°C \leq T1 \leq 1250°C$ and the second heat treatment temperature T2 is set in a range of $T2 \leq T1-50$.

The first and second steps are performed in a Zn atmosphere of at least 1 kPa or more. In particular, this method is effective for the ZnTe single crystal substrate having a thickness of 1 mm or more, which is used for a light modulation element or the like. When the first and second steps are assumed as a cycle, the first and second steps may be repeated predetermined cycle number of times.

In a ZnTe single crystal substrate for a light modulation element according to the present invention, when the substrate has a thickness of 1 mm or more, deposits included in a crystal have sizes of 2 μm or less and have densities of lower than 200 cm$^{-3}$. The above ZnTe single crystal substrate has a light transmission of 50% or more to light beam having a wavelength of 700 nm to 1500 nm. In particular, the ZnTe single crystal substrate has a light transmission of 60% or more to light beam having a wavelength of 900 nm to 1500 nm. By the above heat treatment method according to the present invention, it is possible to provide the ZnTe single crystal substrate as described above.

The following section will describe how the present invention was completed.

First, when the present inventors applied a ZnTe single crystal substrate having a thickness of 2 mm or more used for a light modulation element or the like to the above heat treatment method disclosed in Patent Publication 1, the above-described problem was found. In order to solve the above problem, the above heat treatment method disclosed in Patent Publication 1 was used and the present inventors studied the heat treatment conditions.

Specifically, the temperature of a ZnTe single crystal substrate was increased to the first heat treatment temperature T1 with a predetermined rate (e.g., 15° C./min) and the temperature of the substrate for a predetermined time (e.g., 2 hours) (the first step). Thereafter, the temperature of the substrate was gradually reduced with a predetermined rate (e.g., 0.3° C./min) to the second heat treatment temperature T2 lower than the first heat treatment temperature T1 by 60° C. (the second step). Then, when the first step and second step were assumed as a cycle (about 5.4 hour), the first step and the second step were carried out for the ZnTe single crystal substrate predetermined cycle number of times.

In the case of the heat treatment method in which a heat treatment was carried out for a ZnTe single crystal substrate in a Zn atmosphere to reduce deposits according to the above prior application, it was considered that the heat treatment time depended on a Zn diffusion speed. Therefore, Te deposits remaining in a ZnTe single crystal substrate after the heat treatment were investigated by using the heat treatment time (cycle number) and the temperature as parameters. In order to confirm a Zn diffusion effect due to the heat treatment, a relatively thick ZnTe single crystal substrate having a thickness of about 4 mm was used.

Specifically, a heat treatment was carried out for the ZnTe single crystal substrate at the first heat treatment temperatures T1 of 650° C., 750° C., and 850° C. and for heat treatment time (cycle number) of 54 hours (10 cycles), 108 hours (20 cycles), and 216 hours (40 cycles).

In the above prior application, the first heat treatment temperature T1 was in a range of 0.5M≦T1≦0.65M (M: melting point). That is, when a melting point of ZnTe is 1239° C., the first heat treatment temperature T1 is in a range of 619.5≦T1≦805.35.

Table 1 shows a region in which deposits in the ZnTe single crystal substrate disappear after the above-described heat treatment by using the depth from the surface.

As shown in Table 1, in case that the first heat treatment temperature T1 was 650° C., a region having no deposits was about 0.5 mm from the surface even when the heat treatment time was 216 hours (40 cycle). On the other hand, in case that the first heat treatment temperature T1 was 750° C., a region having no deposits was 0.9 mm from the surface when the heat treatment time was 108 hours (20 cycles). In case that the first heat treatment temperature T1 was 850° C., deposit perfectly disappeared when the heat treatment time was 108 hours (20 cycles). Because Zn diffuses from both faces of the substrate, it was found that a region in which deposits disappeared was 2.0 mm or more when the region was representing by using the depth from the surface.

TABLE 1

| Heat treatment time T1/T2 | 54 hours (10 cycles) | 108 hours (20 cycles) | 216 hours (40 cycles) |
|---|---|---|---|
| 650/590 (° C.) | 0.2 mm | 0.3 mm | 0.5 mm |
| 750/690 (° C.) | — | 0.9 mm | 1.5 mm |
| 850/690 (° C.) | 1.5 mm | 2.0 mm or more | — |

Then, in the ZnTe single crystal substrates for which the above heat treatments were carried out, the light transmission was investigated when light beam having a wavelength of 700 nm to 1500 nm was irradiated to the ZnTe single crystal substrates.

As a result, a ZnTe single crystal substrate in which deposits substantially disappeared when the first heat treatment temperature T1 was 850° C. and the heat treatment time was 108 hours (20 cycles), had a light transmission of 50% or more (at a wavelength of 700 nm to 1500 nm). Prior to the heat treatment, the substrate had a light transmission of 50% or less (at a wavelength 700 nm to 1500 nm).

Further, as a result of carrying out experiments, by carrying out the heat treatment at the first heat treatment temperature of 700° C. to 1250° C. for 20 cycles (108 hours) or more, it was found that the ZnTe single crystal substrate had light a transmission of 50% or more (at a wavelength 700 nm to 1500 nm). In particular, when the first heat treatment temperature was 850° C. or more, Te deposits perfectly disappeared by the heat treatment for 20 cycles. It was found that the substrate was suitable for a light modulation element.

On the other hand, even when the first heat treatment temperature was lower than 700° C., by carrying out a heat treatment for 216 hours (40 cycles), a substrate having a thickness of about 2 mm had light transmission of 50% or more (at a wavelength 700 nm to 1500 nm). However, the conditions were not appropriate as heat treatment conditions from the viewpoint of productivity.

From the above experiment result, the present invention was achieved based on a finding that by carrying out the heat treatment for a ZnTe single crystal substrate at the first heat treatment temperature T1 of 700 to 1250° C. and the second heat treatment temperature of (T1−50) or less, it was possible to effectively eliminate Te deposit part without remarkably deteriorating the productivity and to improve the light transmission of the ZnTe single crystal substrate.

Effect of the Invention

According to the present invention, in the heat treatment method of a ZnTe single crystal substrate, comprises: a first step of increasing a temperature the ZnTe single crystal substrate to a first heat treatment temperature T1, and retaining the temperature of the substrate for a predetermined time; and a second step of gradually reducing the temperature of the substrate from the first heat treatment temperature T1 to a second heat treatment temperature T2 lower than the heat treatment temperature T1 with a predetermined rate, wherein the first heat treatment temperature T1 is set in a range of 700° C.≦T1≦1250° C. and the second heat treatment temperature T2 is set in a range of T2≦T1−50. Therefore, it is possible that deposits in the ZnTe single crystal substrate effectively disappear and that a ZnTe single crystal substrate having a high light transmission is obtained.

According to the ZnTe single crystal substrate for a light modulation element, which is obtained by the above heat treatment method, wherein when the substrate has a thickness of 1 mm or more, deposits included in a crystal have sizes of 2 μm or less and have densities of lower than 200 cm$^3$ and wherein ZnTe single crystal substrate has a light transmission of 50% or more to light beam having a wavelength of 700 nm to 1500 nm, an effect that the a light modulation element having a superior characteristic is realized by using the ZnTe single crystal substrate, can be obtained.

BEST MODE FOR CARRYING OUT THE INVENTION

Hereinafter, a preferred embodiment of the present invention will be described.

In this embodiment, a sample obtained by the following method (substrate) was used. A ZnTe single crystal substrate having a diameter of 2 to 3 inches and having a plane orientation of (100) or (110) was obtained by a melt growth using gallium (Ga) as a dopant. The obtained substrate is sliced so as to have a thickness of 0.7 to 4.0 mm. The wrapping using #1200 abrasive grain and the etching using Br$_2$3% MeOH were carried out for the surface of the sliced substrate to use it as the sample (substrate).

Before the heat treatment for the ZnTe single crystal substrate, the ZnTe single crystal substrate and Zn were placed at a predetermined position in a quartz ampule and the ampule was sealed at a vacuum degree of 1.0 Pa or less. Then, the quartz ampule was placed in a diffusion furnace to perform the following heat treatment.

Figure 1:
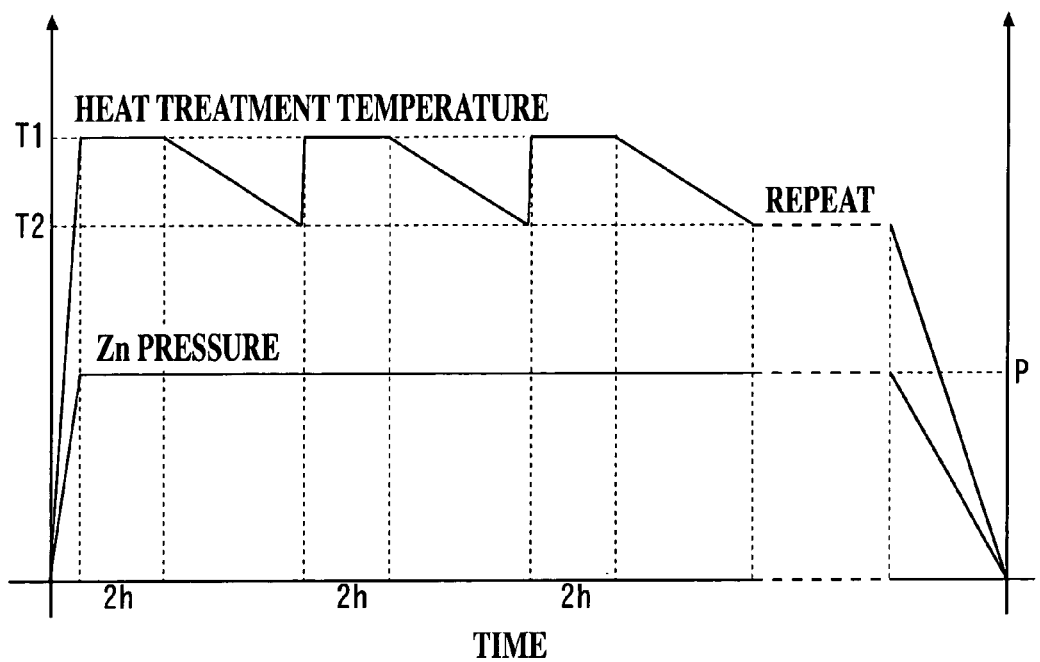
FIG. 1 This is an explanation view showing a temperature profile a heat treatment for which a ZnTe single crystal substrate is carried out in an embodiment.

The heat treatment according to this embodiment was performed in accordance with the temperature profile of FIG. 1. Specifically, a part at which the ZnTe single crystal substrate was placed was heated to the first heat treatment temperature T1=of 850° C. with a rate of 15° C./min for example and the temperature was retained at 850° C. for 2 hours (the first step). A part at which Zn was placed was heated so that a Zn pressure P was 1.0 kPa or more.

Next, the temperature of the substrate was gradually reduced with a rate of 0.3° C./min to the second heat treatment temperature T2 of 790° C. (T2≦T1−50) (the second step). Specifically, the heat treatment time in the second step was 60/0.3=200 minutes.

Then, when the heat treatment comprising the above-described first and second steps, that is, the process in which the temperature of the ZnTe single crystal is increased to the first heat treatment temperature T1, the temperature of the substrate is retained for 2 hours and then the temperature of the substrate is reduced to the second heat treatment temperature T2, is assumed as one cycle (about 5.4 hours), the process was repeated 20 cycles (about 108 hours).

Thereafter, the temperature of the part at which the ZnTe single crystal substrate was placed was reduced to a room temperature with a rate of 15° C./min for example, and the heat treatment was completed. The temperature of the part at which Zn was placed was similarly reduced to the room temperature.

Then, the wrapping and etching processing was carried out for the ZnTe single crystal substrate which was obtained after the heat treatment, under the conditions which were the same as those of the previous processing. Then, the light transmission of the substrate was measured and the status of the surface was observed.

Figure 2:
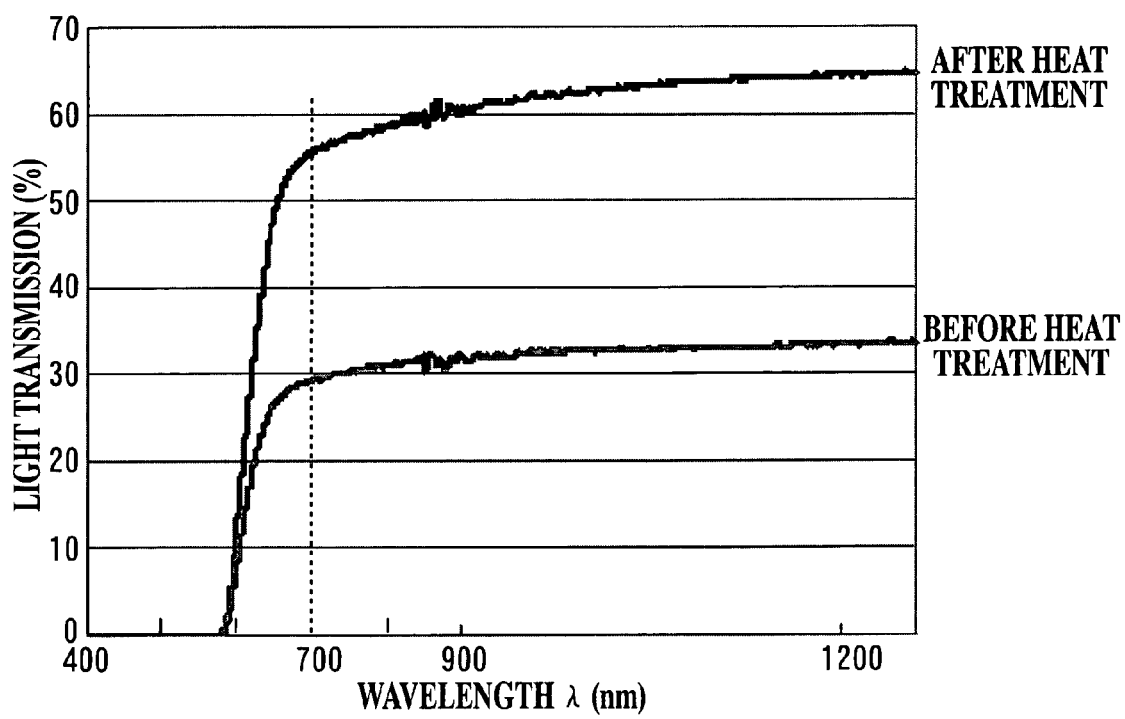
FIG. 2 This is an explanation view showing the light transmission of the ZnTe single crystal substrate before and after the heat treatment in the embodiment.

FIG. 2 is an explanation view showing the light transmission of the ZnTe single crystal substrate before and after the heat treatment of this embodiment. As shown in FIG. 2, the ZnTe single crystal substrate which was obtained after the heat treatment had the light transmission of 50% or more to the light beam having a wavelength of 700 nm or more. On the other hand, the ZnTe single crystal substrate which was prepared before the heat treatment had the light transmission of about 30% to the light beam having a wavelength of 700 nm or more. Thus, it was confirmed that the light transmission was remarkably improved by carrying out the heat treatment according to this embodiment.

In case of any of the ZnTe single crystal substrates having a thickness of 0.7 to 4.0 mm, the light transmission equal to the above-described ones were obtained regardless of the thickness. Because it is considered that the reduction in the light transmission is mainly caused by the reflection at the surface and light hardly absorbed by the ZnTe single crystal, it can be easily assumed that the similar light transmission also can be obtained by a ZnTe single crystal substrate having a thickness of 4.0 mm or more.

Figure 3:
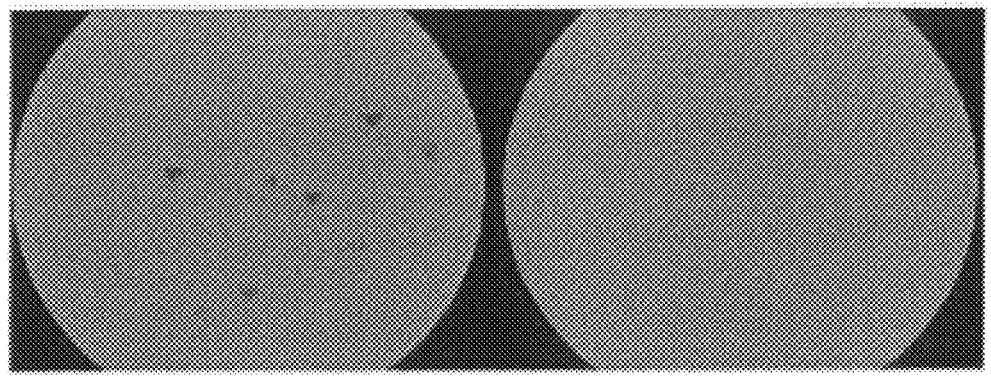
FIG. 3 These are explanation views showing the surface status (Te deposit) of the ZnTe single crystal substrate before and after the heat treatment in the embodiment.

FIG. 3 is explanation views showing the result of the observation of the ZnTe single crystal substrate before and after the heat treatment of this embodiment by a transmission type of optical microscope. FIG. 3(a) shows the observation result of the ZnTe single crystal substrate before the heat treatment. FIG. 3(b) shows the observation result of the ZnTe single crystal substrate after the heat treatment. As shown in FIG. 3(a), Te deposits were scattered in the substrate before the heat treatment. It was confirmed by observing the cross section of the substrate that Te deposits having sizes of 2 μm or more and having a density of $10^5$ cm$^{-3}$ or more remained in the substrate. On the other hand, as shown in FIG. 3(b), it was confirmed that no Te deposit having a size of 2 μm or more remained in the substrate obtained after the heat treatment.

As described above, in accordance with the heat treatment method according to this embodiment, Te deposits in the ZnTe single crystal substrate can be effectively eliminated and the light transmission can be 50% or more to the light beam having a wavelength of 700 nm or more. Thus, by using the ZnTe single crystal substrate as described above, it is possible to realize a light modulation element having a superior characteristic.

As described above, the invention made by the present inventors is specifically described based on the embodiment. However, the present invention is not limited to the above embodiment.

For example, although the first heat treatment temperature T1 was 850° C. in the above embodiment, a ZnTe single crystal substrate having a similar light transmission can be obtained by setting the first heat treatment temperature T1 in a range of 700 to 1250° C.

Furthermore, the heat treatment time (retention time) of the first step and the heat treatment time (temperature reducing rate) of the second step are not particularly limited and can be appropriately changed.

Although the second heat treatment temperature T2 was set to be lower than the first heat treatment temperature T1 by 60° C. in the above embodiment, the second heat treatment temperature T2 may be set to be lower than the first heat treatment temperature T1 by 50° C. or more. Although the second heat treatment temperature T2 may be a room temperature, the second heat treatment temperature T2 is preferably (T1−200) ° C. or more and more preferably (T1−100) ° C. or more from the industrial viewpoint.

The present invention is a technique for a heat treatment method of a ZnTe single crystal substrate. However, it is considered that the present invention is effective to reduce deposits in crystals of general II-VI group compound semiconductors other than ZnTe.

The invention claimed is:

1. A heat treatment method of a ZnTe single crystal substrate, comprising:
   a first step of increasing a temperature the ZnTe single crystal substrate to a first heat treatment temperature T1, and retaining the temperature of the substrate for a predetermined time; and
   a second step of gradually reducing the temperature of the substrate from the first heat treatment temperature T1 to a second heat treatment temperature T2 lower than the heat treatment temperature T1 with a predetermined rate,
   wherein the first heat treatment temperature T1 is set in a range of 750° C.≦T1≦1250° C. and the second heat treatment temperature T2 is set in a range of T2≦T1−50,
   wherein in a Zn atmosphere of at least 1 kPa or more, a heat treatment including the first and second steps is performed not less than 40 cycles and for not less than 216 hours, and
   wherein the ZnTe single crystal substrate has a thickness of 1.5 mm or more.

2. The heat treatment method of the ZnTe single crystal substrate as claimed in claim 1, wherein:
   the ZnTe single crystal substrate has a transmission of 50% or more to a beam having a wavelength of 700 nm to 1500 nm.

3. A heat treatment method of a ZnTe single crystal substrate, comprising:
   a first step of increasing a temperature of the ZnTe single crystal substrate to a first heat treatment temperature T1, and retaining the temperature of the substrate for a predetermined time; and
   a second step of gradually reducing the temperature of the substrate from the first heat treatment temperature T1 to a second heat treatment temperature T2 lower than the heat treatment temperature T1 with a predetermined rate,
   wherein the first heat treatment temperature T1 is set in a range of 850° C.≦T1≦1250° C. and the second heat treatment temperature T2 is set in a range of T2≦T1−50,
   wherein in a Zn atmosphere of at least 1 kPa or more, a heat treatment including the first and second steps is performed not less than 10 cycles and for not less than 54 hours, and
   wherein the ZnTe single crystal substrate has a thickness of 1.5 mm or more.

4. The heat treatment method of the ZnTe single crystal substrate as claimed in claim 3, wherein:
   the ZnTe single crystal substrate has a transmission of 50% or more to a beam having a wavelength of 700 nm to 1500 nm.

* * * * *